United States Patent [19]

Okumura

[11] Patent Number: 5,045,419
[45] Date of Patent: Sep. 3, 1991

[54] PATTERN EXPOSURE/TRANSFER METHOD AND PATTERN EXPOSURE/TRANSFER MASK APPARATUS

[75] Inventor: Katsuya Okumura, Yokohama, Japan

[73] Assignee: Kabushiki Kaisha Toshiba, Kawasaki, Japan

[21] Appl. No.: 456,210

[22] Filed: Dec. 26, 1989

Related U.S. Application Data

[63] Continuation of Ser. No. 120,477, Nov. 13, 1987, abandoned.

[30] Foreign Application Priority Data

Nov. 20, 1986 [JP] Japan ................................ 61-277327

[51] Int. Cl.$^5$ .......................... G03C 5/06; G03B 27/32
[52] U.S. Cl. ........................................ 430/20; 355/53;
428/1; 430/311; 430/5; 359/40; 359/54
[58] Field of Search .............................. 430/20, 311, 5;
350/334, 342; 428/1; 355/125, 53

[56] References Cited

U.S. PATENT DOCUMENTS

| 4,297,022 | 2/1981 | Lester | 355/3 R |
|---|---|---|---|
| 4,297,022 | 10/1981 | Lester | 355/3 R |
| 4,727,380 | 2/1988 | Miura et al. | 346/108 |
| 4,805,002 | 2/1989 | Sasago et al. | 355/53 |

FOREIGN PATENT DOCUMENTS 61-212843 9/1986 Japan ................................ 430/20

Primary Examiner—Charles L. Bowers, Jr.
Assistant Examiner—Ashley I. Pezzner
Attorney, Agent, or Firm—Finnegan, Henderson, Farabow, Garrett, and Dunner

[57] ABSTRACT

According to a pattern exposure/transfer method disclosed in the present invention, an optical modulating mask whose optical contrast can be changed by electrical control is used and an optical pattern image of the optical modulating mask is exposed/transferred to an object to be exposed. The present invention also discloses a pattern exposure/transfer mask apparatus whose optical contrast can be changed by electrical control. According to the pattern exposure/transfer method of the present invention, an arbitrary pattern image can be easily formed by the optical modulating mask. The pattern exposure/transfer mask apparatus of the present invention is able to change optical contrast by electrical control, and allows easy formation of an arbitrary pattern image.

6 Claims, 2 Drawing Sheets

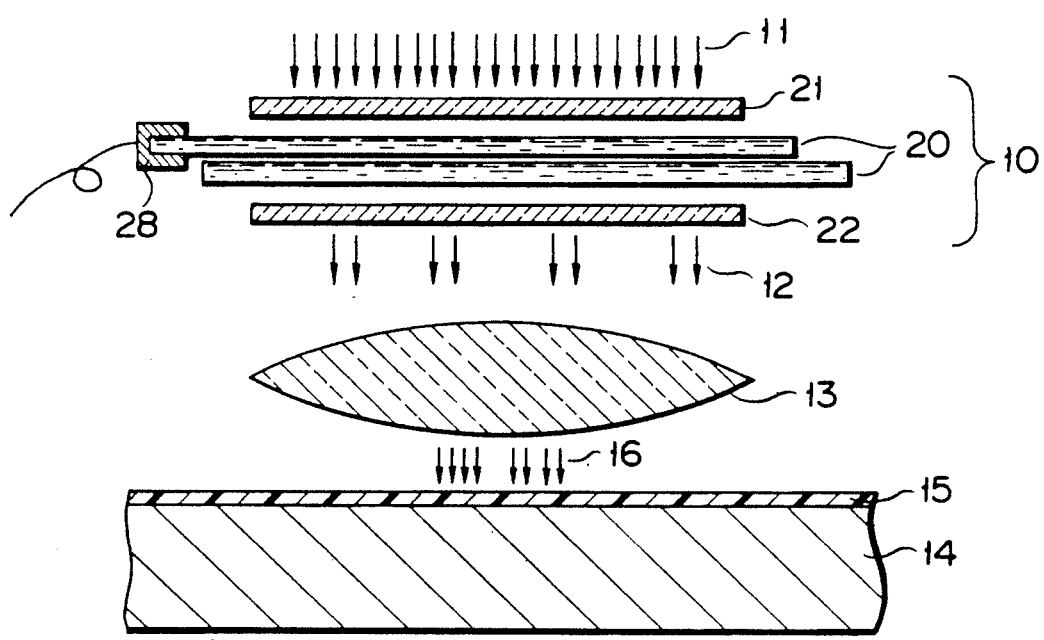
F I G. 1

PATTERN EXPOSURE/TRANSFER METHOD AND PATTERN EXPOSURE/TRANSFER MASK APPARATUS

This application is a continuation of application Ser. No. 120,477, filed Nov. 13, 1987, now abandoned.

BACKGROUND OF THE INVENTION

The present invention relates to a pattern exposure/transfer method and a pattern exposure/transfer mask apparatus used for manufacturing semiconductor devices.

When a micropattern image is transferred to a photoresist coated on a surface of a semiconductor wafer, according to a conventional method, an enlarged image (normally, ×5) of a desired pattern or a photomask of a metal film such as a chrominum film is preformed on a glass mask of quartz or the like, and the pattern is exposed/transferred to the photoresist. Thus, the desired pattern is transferred to the surface of the wafer having a large area using the step-and-repeat system.

The above-described method is optimal for manufacturing an LSI such as a memory by transferring a single photomask image to a large number of wafers. However, in the case of the custom LSI manufacture where a single pattern image is transferred to only a small number of wafers and a demand for shortening a time required for transferring a pattern after its design is determined is strong, the above-described method wherein an enlarged image is formed on a glass mask and is then transferred is time consuming.

Thus, instead of forming an enlarged image on a glass mask, a method of directly drawing a desired image on a wafer using an electron beam exposure has been proposed.

However, in this direct drawing method, the apparatus is expensive and productivity is too low.

A pattern exposure method for manufacturing semiconductor devices according to the present invention is provided to solve the problem, i.e., that a time required for the pattern exposure/transfer process tends to be long. It is an object of the present invention to provide a pattern exposure/transfer method which allows easy formation of an arbitrary pattern image and shortens a time required for performing exposure/transfer after a pattern is determined.

It is another object of the present invention to provide a pattern transfer mask apparatus which allows easy formation of an arbitrary pattern image used for the above pattern exposure method.

SUMMARY OF THE INVENTION

According to a pattern exposure/transfer method of the present invention, an optical modulating mask whose optical contrast can be changed by electrical control is used and an optical pattern image of the optical modulating mask is exposed/transferred to an object to be exposed.

According to the pattern exposure/transfer method of the present invention, an arbitrary pattern image can be easily formed by the optical modulating mask. Therefore, a time required for performing exposure/transfer after a pattern is determined can be shortened.

In addition, a pattern exposure/transfer mask apparatus according to the present invention has optical contrast which can be changed by electrical control.

The pattern exposure/transfer mask apparatus of the present invention allows easy formation of an arbitrary pattern image.

BRIEF DESCRIPTION OF THE DRAWINGS

FIG. 1 is a view showing a pattern exposure apparatus using an optical modulating mask for pattern exposure/transfer.

DETAILED DESCRIPTION OF THE PREFERRED EMBODIMENT

Figure 2A:
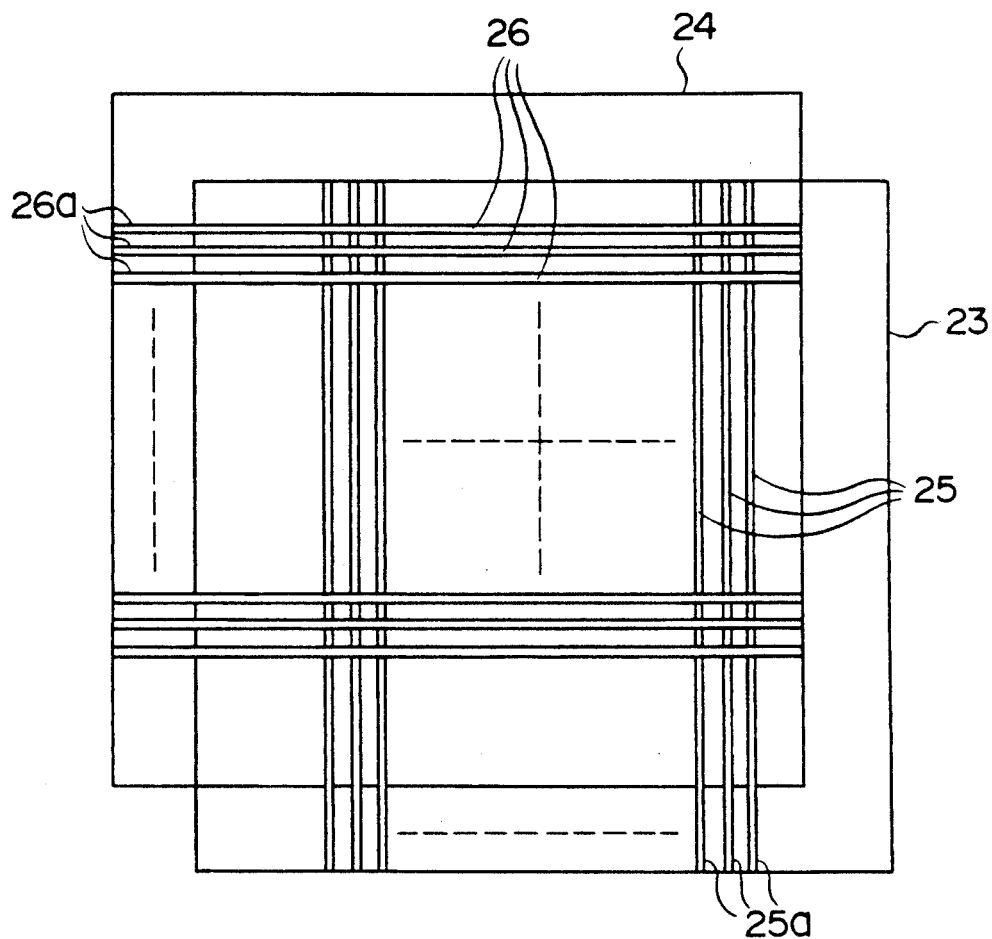
FIG. 2A is a plan view of a liquid crystal cell plate constituting the optical modulating mask shown in FIG. 1.

The present invention will be described in detail with reference to the accompanying drawings. FIG. 1 is a view showing a pattern exposure apparatus using an optical modulating mask for pattern exposure/transfer. Reference numeral 10 denotes an optical modulating mask for pattern exposure/transfer; 11, parallel light beams emitted by a light source (not shown) and collimated by a lens or the like; 12, pattern image light beams which is passed through optical modulating mask 10; and 13, a lens for transmitting pattern image light beams 12 therethrough and reducing the pattern image to, e.g., 1/100. Photoresist 15 coated on semiconductor wafer 14 is exposed to projected image light beams which passed through lens 13. Semiconductor wafer 14 is mounted on an X-Y stage (not shown). This stage performs drive/control for pattern image projection in the step-and-repeat system and constitutes a part of the step-and-repeat exposure apparatus.

Optical modulating mask 10 is designed such that its optical contrast can be changed by an electrical means.

FIG. 1 shows a practical example of optical modulating mask 10 having transmission liquid crystal cell plate 20 for optical modulation sandwiched between a pair of deflecting plates 21 and 22. Liquid crystal cell plate 20 has a plurality of segments. Electrical signals are applied to the segments so as to change optical contrast and form an arbitrary pattern image.

Figure 2B:
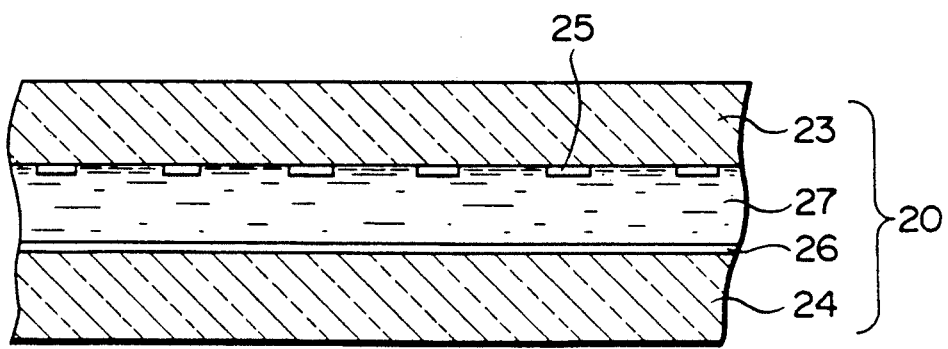
FIG. 2B is a side sectional view showing the liquid crystal cell plate constituting the optical modulating mask shown in FIG. 1.

The process of forming a mask pattern for contact holes of a custom LSI will be described as an example of liquid crystal cell plate 20 with reference to FIGS. 2A and 2B. Reference numerals 23 and 24 denote glass plates having a size of 150 150 mm and a thickness of 2 mm, respectively. After a 1000-Å thick transparent conductive film made of a tin indium oxide is deposited on opposite surfaces of glass plates 23 and 24, the resultant surfaces are patterned so as to leave 100 each of stripes 25 and 26 having a pitch of 1 mm and a width of 200 μm. Stripes 25 and 26 respectively formed on the opposite surfaces of glass plates 23 and 24 are perpendicular to each other. Glass plates 23 and 24 are spaced apart from each other by 10 μm except for portions corresponding to end portions (transparent conductive film terminals) 25a and 26a, and are fixed to each other through a spacer (not shown).

A surface treatment is performed on each of the opposite surfaces (inner surfaces) of glass plates 23 and 24 so as to allow liquid crystal molecules 27 to be easily oriented. Nematic liquid crystal molecules 27 are injected and sealed into a space between glass plates 23 and 24. In this case, since a surface treatment is performed on each of the opposite surfaces (inner surfaces)

of glass plates 23 and 24, liquid crystal molecules 27 are aligned parallel to glass plates 23 and 24 and rotated through 90° along the surface treatment direction.

Liquid crystal cell plate 20 has a two-dimensional pattern constituted by stripes of the two glass plates aligned in a lattice-like manner at a pitch of 1 mm.

When a voltage of 10 V is applied from an external source to the stripes of the two glass plates through transparent conductive film terminals 25a and 26a, liquid crystal molecules 27 are oriented in a direction of the electric field and the rotatory polarization of light is lost. When the voltage application is stopped, liquid crystal molecules 27 are aligned in the initial state and the rotatory polarization of light is recovered. A response time of this phenomenon was confirmed to be on the order of 10 ms as a result of actual measurement.

A pair of deflecting plates 21 and 22 sandwiching liquid crystal cell plate 20 are disposed so as to direct deflected light beams parallel to each other. In this case, as described above, liquid crystal cell plate 20 is designed to rotate the light beams through 90° when a voltage is not applied so that the light beams are not transmitted through a pair of deflecting plates 21 and 22.

The pattern exposure method will be described with reference to FIG. 1. Transparent conductive film terminals 25a and 26a of glass plates 23 and 24 of liquid crystal cell plate 20 are respectively fitted in sockets 28 (for illustrative convenience, only a single socket corresponding to one of the glass plates, glass plate 23, is shown). Stripes 25 and 26 of glass plates 23 and 24 corresponding to desired contact hole forming positions are selected and a voltage of 10 V is applied to the selected stripes. In this case, a voltage of +5 V is applied to the selected stripes of one glass plate from an external power source (not shown), and a voltage of −5 V is applied to the selected stripes of the other glass plate from an external power source (not shown). As a result, liquid crystal molecules 27 are oriented to be perpendicular to the surfaces of the glass plates at the crossing areas of the selected stripes, thereby losing the rotatory polarization of light. Therefore, when parallel light beams 11 are incident on the entire surface of deflecting plate 21, the light beams are transmitted only through the selected stripe crossing areas as described above, and are then transmitted through lower deflecting plate 22. Optical image 12 output through optical modulating mask 10 is reduced to 1/100 by lens 13 and exposed/transferred to photoresist film 15. In this case, a pattern image of a 100 mm × 100 mm area including all crossing areas of 100 × 100 stripes in liquid crystal cell plate 20 is reduced to a pattern image of a 1 mm × 1 mm area. A stripe crossing area of 200 µm × 200 µm in liquid crystal cell plate 20 is reduced to a micro image array (a contact hole image) of 2 µm × 2 µm. Thus, the microimage array (a contact hole array) of 2 µm × 2 µm can be formed within the above-described area of 1 mm × 1 mm at a pitch of 10 µm. Exposure/transfer can be performed by selecting stripes of liquid crystal cell plate 20 and applying a voltage to the selected stripes, so that photoresist film 15 can be exposed only at portions corresponding to desired contact hole forming positions within the contact hole array. After exposure to the area of 1 mm × 1 mm is completed, wafer 14 is moved by 1 mm, and a desired contact hole pattern image is exposed to the next area of 1 mm × 1 mm.

Areas to be exposed on wafer 14 are sequentially exposed in the above-described manner.

It took about 5 minutes to expose the required area on a wafer having a diameter of 125 mm using the above-described exposure/transfer method.

According to the optical modulating mask used for the pattern exposure/transfer method, since optical modulation can be electrically performed and an arbitrary image can be easily formed, pattern polarization can be easily and quickly performed.

Therefore, according to the pattern exposure/transfer method using the optical modulating mask, when various pattern images are exposed to a single wafer, a time required for performing exposure/transfer after a pattern is determined can be shortened and small numbers of various types of custom LSIs can be manufactured and delivered within a short period of time. In addition, a considerably inexpensive step-and-repeat exposure apparatus compared with a wafer direct drawing apparatus can be used, and hence the method is very economical.

Note that although only a single optical modulating mask is used in the above embodiment, a plurality of optical modulating masks can be used so as to transfer a more complicated pattern image. Although a combination of a pair of deflecting plates and a liquid crystal cell plate is used as the optical modulating mask, a mask for performing optical modulation using an electrochromic phenomenon or an electrophorestic phenomenon can be used. A scale reduction ratio upon projection/transfer can be adequately selected according to a resolution of an optical modulating mask.

Furthermore, the present invention can be applied when a pattern image is exposed/transferred to a printed circuit board, a ceramic substrate, a glass plate for liquid crystal display, and the like other than the semiconductor wafer. The present invention is not limited to reduction transfer of a pattern image, but is applicable to one-to-one transfer and enlargement transfer. The step-and-repeat exposure apparatus is not necessarily required.

What is claimed is:

1. A method of exposing a pattern onto a photoresist layer deposited on a semiconductor substrate, comprising the steps of:
   providing an optical modulating mask including first and second glass plates facing each other, a liquid crystal layer sandwiched between the first and second glass plates, said liquid crystal layer having a liquid crystal molecules, first stripes arranged on an inner surface of said first glass plate, and second stripes arranged on an inner surface of said second glass plate in a direction perpendicular to that of said first stripes to define a plurality of stripe crossing areas in the liquid crystal layer;
   selectively applying voltages to said first and second stripes for orienting the liquid crystal molecules in a direction perpendicular to the surfaces of the first and second glass plates at the crossing areas of the voltage-applied selected stripes that correspond to the pattern being exposed; and
   applying parallel light beams onto an entire surface of the optical modulating mask with the light beams being transmitted only through the stripe crossing areas of the voltage-applied selected stripes of the liquid crystal layer to produce a desired optical image.

2. A method according to claim 1, which further comprises the steps of reducing the optical image, and transmitting the reduced optical image onto the photoresist layer deposited on the semiconductor substrate.

3. A pattern exposure mask apparatus comprising:
a first glass plate;
a second glass plate facing said first glass plate;
a liquid crystal layer, including liquid crystal molecules, sandwiched between said first and second glass plates;
first stripes arranged on an inner surface of said first glass plate;
second stripes arranged on an inner surface of said second glass plate in a direction perpendicular to that of said first stripes for defining a plurality of stripe crossing areas in the liquid crystal layer;
means for selectively applying voltages to said first and second stripes for orienting the liquid crystal molecules in a direction perpendicular to the surfaces of the first and second glass plates at the crossing areas of the voltage-applied selected stripes that correspond to the pattern being exposed; and
means for applying parallel light beams onto an entire surface of the optical modulating mask with the light beings being transmitted only through the selected stripe crossing areas of the liquid crystal layer to produce a desired optical image.

4. An apparatus according to claim 3, which further comprises means for reducing the optical image, and means for transmitting the reduced optical image onto a photoresist layer deposited on a semiconductor substrate.

5. An apparatus according to claim 3, wherein said parallel light beam applying means includes a pair of deflecting plates for directing the parallel light beams onto the entire surface of the optical modulating mask.

6. An apparatus according to claim 4, wherein said means for reducing the optical image includes lens means.

* * * * *